US005789279A

United States Patent [19]

Crema

[11] Patent Number: 5,789,279

[45] Date of Patent: Aug. 4, 1998

[54] METHOD AND APPARATUS FOR ELECTRICALLY INSULATING HEAT SINKS IN ELECTRONIC POWER DEVICES

[75] Inventor: Paolo Crema, Bernareggio, Italy

[73] Assignee: SGS-Thomson Microelectronics S.r.l.

[21] Appl. No.: 527,858

[22] Filed: Sep. 14, 1995

[30] Foreign Application Priority Data

Sep. 20, 1994 [EP] European Pat. Off. .............. 94830442

[51] Int. Cl.$^{6}$ .............................. H01L 21/44

[52] U.S. Cl. .............................. 438/122; 438/121

[58] Field of Search .............................. 438/121, 122, 438/123, 124

[56] References Cited

FOREIGN PATENT DOCUMENTS

A-2900 114 2/1980 German Dem. Rep. .
55-143054 11/1980 Japan .
60-77445 5/1985 Japan .
60-132350 7/1985 Japan .
61-194755 8/1986 Japan .
2 084 796 4/1982 United Kingdom .

OTHER PUBLICATIONS

European Search Report from European Patent Application Serial No. 94830442.3, filed Sep. 20, 1994.

*Primary Examiner*—Kevin Picardat
*Attorney, Agent, or Firm*—Wolf, Greenfield & Sacks, P.C.

[57] ABSTRACT

A method and apparatus for electrically insulating heat sinks in electronic power devices that includes the formation of an insulating layer on the face of the electronic device having the heat sink. The insulating layer may be formed from an epoxy resin, commonly known as "solder mask" in the manufacture of printed circuits.

34 Claims, 3 Drawing Sheets

16 15 9 15 15 6 5 2 11 11 2 5

METHOD AND APPARATUS FOR ELECTRICALLY INSULATING HEAT SINKS IN ELECTRONIC POWER DEVICES

BACKGROUND OF THE INVENTION

1. Field of the Invention

The present invention relates to a method and apparatus for electrically insulating heat sinks in electronic power devices.

2. Discussion of the Related Art

It is known that some electronic power devices that dissipate considerable heat are provided with heat sinks. With reference to FIG. 1, the device includes an integrated circuit chip 1 placed within a package 2 made of epoxy resin. The chip is connected by solder to a heat sink 3 which is conventionally made of a metal having high thermal conductivity, typically copper. One face of the heat sink 3 protrudes outside the electronic device so as to convey the flow of heat to the surrounding air. The heat sink must have particular characteristics, namely high thermal conductivity and a large dissipation surface.

In some applications, such as for example high fidelity audio devices, it is desirable to connect the heat sink to the external metal chassis of the audio device, so as to further increase the dissipation surface and accordingly improve heat dissipation. However, this arrangement has the drawback that the chassis of the audio device may have an electrostatic or other potential that can negatively affect the operation of the integrated chip. In some cases, the voltage between the chassis, the heat sink, and the integrated chip can irreversibly damage the chip of the power device.

Accordingly, it is desirable to electrically insulate the heat sink from the mechanical structures with which it is placed in contact. However, at the same time it is desirable to maintain the thermal conductivity of the device, i.e. its heat dissipation, at an optimum level.

A possible solution to this problem is to provide an insulating layer 4 (FIG. 2) on the heat sink 3 during the molding of the package 2 that contains the chip 1. This method for insulating the heat sink is not advisable, since it is difficult to ensure the thickness of the insulating layer. On one hand, if the insulating layer is too thick, the heat sink is unable to dissipate heat externally. On the other hand, if the thickness is insufficient, some regions of the heat sink may remain exposed.

Another possible solution uses a layer of metal, typically aluminum, which is deposited on the heat sink and then oxidized. This method has the drawback that it makes the production process more complicated and has a high cost.

Another possible solution is to deposit an insulating layer by virtue of chemical treatments. This method is not advisable because chemical treatments are poorly selective and might contaminate the chip of the power device or cover the contacts 5 (FIG. 1) of the device.

SUMMARY OF THE INVENTION

The foregoing problems of the prior art are overcome by one illustrative embodiment of the invention, in which a method and apparatus are provided for electrically insulating heat sinks in electronic power devices, the method and apparatus providing effective electrical insulation of the heat sink and preserving the desired thermal conductivity characteristics of the device. The method and apparatus comprise the formation of an insulating layer on the face of the electronic device that comprises the heat sink and the resulting electronic device, respectively.

In one embodiment of the present invention, the insulating layer is an epoxy resin, commonly known as "solder mask" in the manufacture of printed circuits.

BRIEF DESCRIPTION OF THE DRAWINGS

The characteristics and advantages of the invention will become apparent from the description of a preferred but not exclusive embodiment, illustrated only by way of non-limitative example in the accompanying drawings, in which.

DETAILED DESCRIPTION

Figure 1:
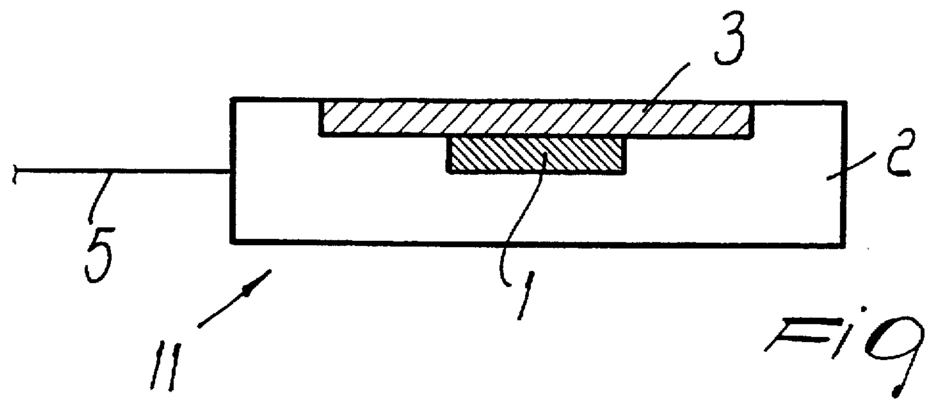
FIG. 1 is a cross-sectional view of an electronic power device without heat sink insulation.
Figure 2:
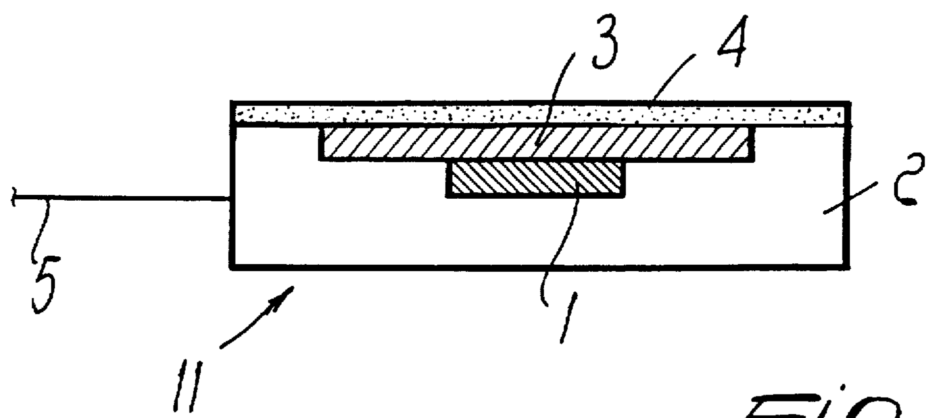
FIG. 2 is a cross-sectional view of an electronic power device with heat sink insulation.
Figure 3:
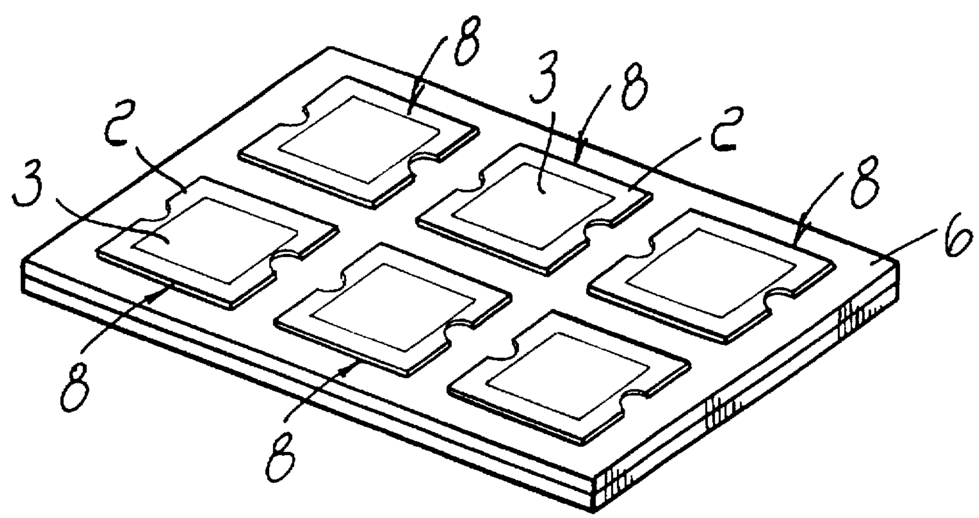
FIG. 3 is a perspective view of a group of electronic power devices seated in a production mold.
Figure 4:
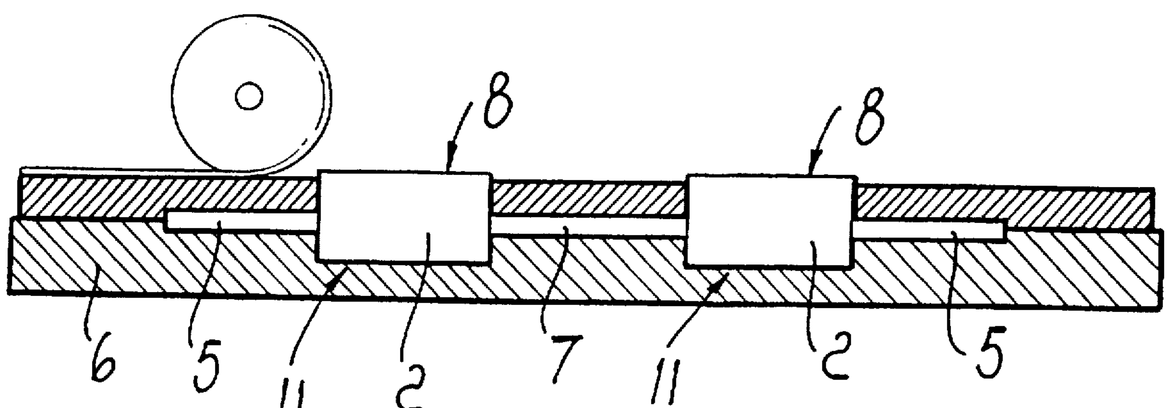
FIG. 4 is a cross-sectional view of power devices seated in a production mold and being treated according to the method of the present invention.

With reference to the above figures, a group of power devices is each in a mold 6 so that an upper part 8, which comprises the face of the heat sink, protrudes above the outer wall of the mold, as shown in FIG. 3.

The mold 6 and the power devices 11 are inserted into a laminating machine during a lamination step. The machine may be of the type commonly used to deposit an insulating layer of epoxy resin on printed circuit boards. This resin is commonly termed "solder mask." The laminating machine usually comprises two rollers on which two layers of material are rolled. The first layer 9 (FIG. 5) is the layer of epoxy resin, and a second layer 10 (FIG. 5) is a backing layer made of polyester.

The mold 6, together with the devices 11, are made to advance inside the laminating machine so that the devices 11 are subjected exclusively to the action of the upper roller, i.e. the roller that faces the protruding parts 8 of the power devices. The two layers 9 and 10 are deposited in a heated atmosphere to facilitate contact between the epoxy resin 9, which is still in the gel state, the mold 6, and the power devices 11.

The entire system is then cooled so as to stop the movement of the gel that constitutes the layer 9 of epoxy resin. Once the gel 9 has cooled, the backing layer 10 is peeled off so as to leave the gel layer 9 exposed. Since the gel-layer is spread over the entire work area (the mold 6 and the devices 11), it is selectively removed from the parts that cover the mold 6.

Figure 7:
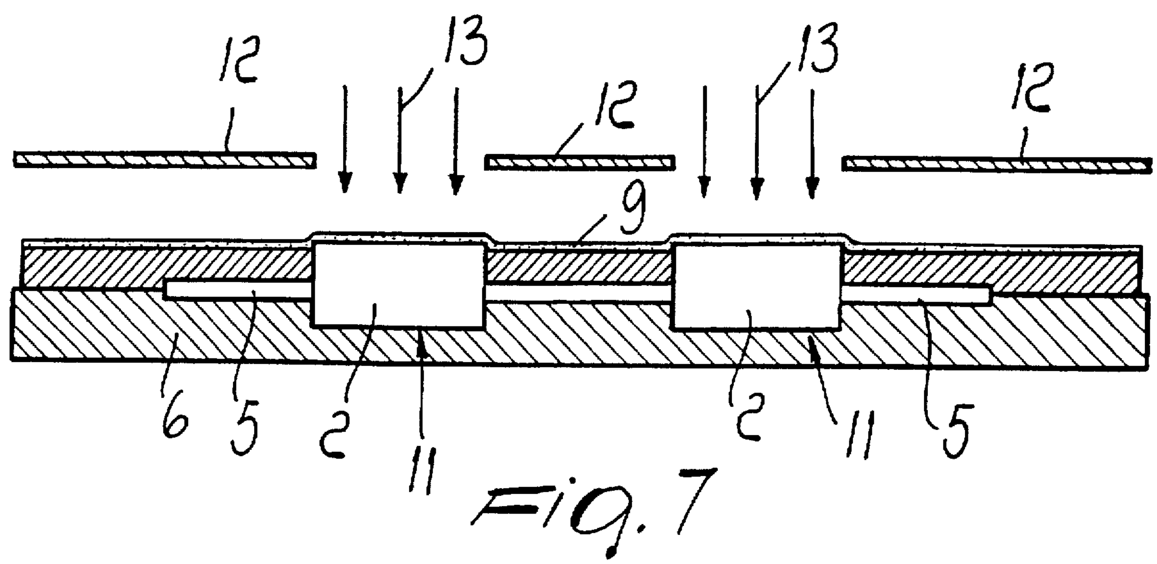
FIG. 7 is a cross-sectional view of the power devices and of the mold, treated according to an additional step of the method of the present invention.

To remove layer 9 from the parts that cover mold 6, a mask 12 (FIG. 7) is applied that is provided with openings that allow the passage of ultraviolet rays only on the regions of the resin 9 that cover the power devices 11. These regions are accordingly exposed to UV rays 13 (FIG. 7) so as to cure or polymerize them. As a result, these regions cannot be removed with chemical treatments.

Figure 8:
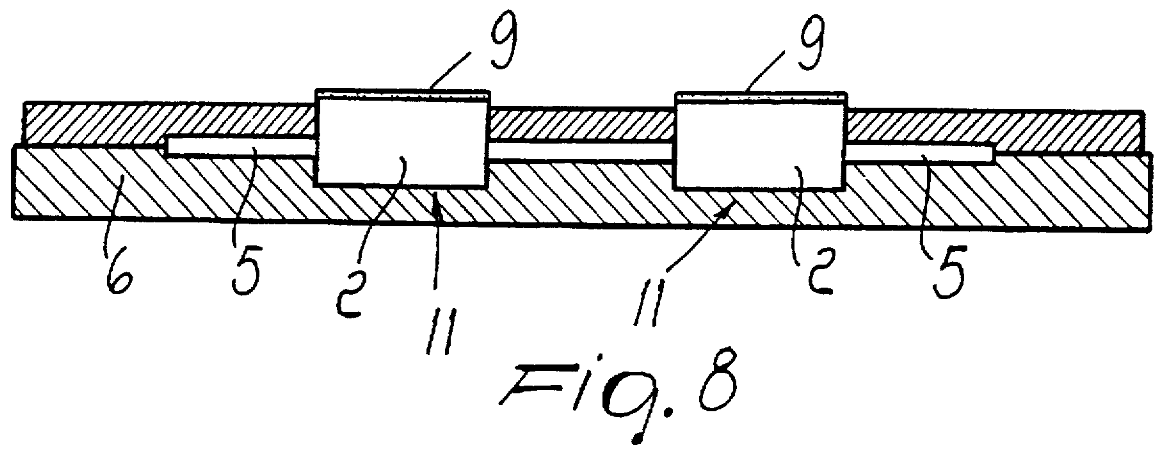
FIG. 8 is a cross-sectional view of power devices obtained with the method of the present invention.

To remove the resin 9 placed on the mold 6, a chemical treatment with a saline solution of sodium carbonate, $Na_2CO_3$, is performed, etching the regions that have not been exposed and cured by the UV rays 13. In this manner, the structure shown in FIG. 8 is obtained, wherein the insulating layer 9 is left only on the devices 11.

Figure 5:
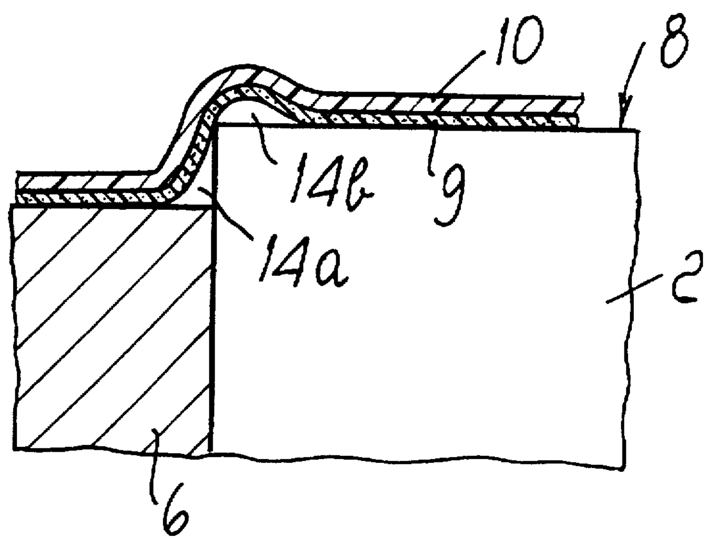
FIG. 5 is a cross-sectional view of the package of the power device and of the mold, treated according to the method of the present invention.
Figure 6:
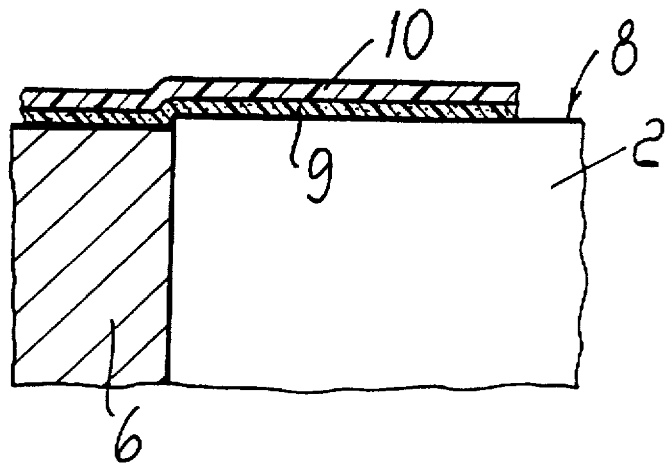
FIG. 6 is a cross-sectional view of the package of the power device and of the mold, treated according to the method of the present invention.

The insulating layer 9 (epoxy resin) is still not mechanically strong (i.e., it can still be scratched and damaged mechanically). To improve the mechanical strength of the insulating layer 9, a further curing or polymerization with UV rays 13 is performed. Finally, heat curing in an oven is performed for about 8 hours at approximately 170° C., further polymerizing both the insulating layer 9 and the package 2 of the power device 11. To achieve better results, the upper part 8 of the package 2 should protrude only by an amount that is equal to or smaller than the thickness of the layer of resin 9, as shown in FIG. 6. If instead the upper part 8 protrudes by more than that amount, as shown in FIG. 5, air pockets 14*a* and 14*b* form. This effect may be undesirable, since after removal of the unwanted regions of the insulating layer 9 it leaves exposed surfaces of the device 11 and the heat sink 3.

The rolls of epoxy resin 9, in the dry state, are supplied by the supplier in guaranteed thicknesses. In this way it is possible to have a uniform thickness of, for example, 25 or 50 μm. It is furthermore not necessary to produce special rolls or special machines, since they are already available for the production of printed circuit boards.

Another advantage is that the invention uses the existing step for the heat curing of the package 2 of the device to also cure the insulating layer 9.

Figure 9:
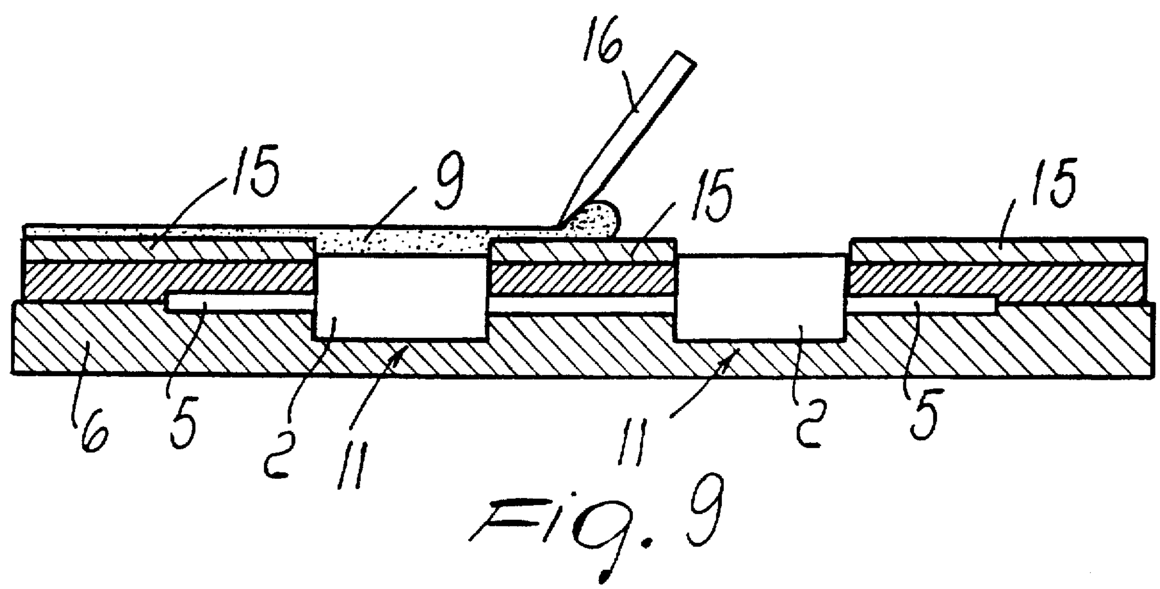
FIG. 9 is a cross-sectional view of the power devices seated in the mold and treated according to another embodiment of the method of the present invention.

A second embodiment of the present invention shown in FIG. 9 spreads, by means of a doctor 16, gelatinous (liquid) resin 9 through a screen-printing frame 15 having a thickness that meets the thickness requirements of the above-described insulating layer that forms the devices 11. This step is followed by UV-ray curing and by heat curing as already described. The thickness of the insulating layer is controlled by the thickness of the screen-printing frame and by the density of the resin in the liquid state.

Devices formed in accordance with the above-described methods have been found to perform well. A film of dry resin with a thickness of 50μm insulates the heat sink from a 1000-V voltage with a loss of 5 nA. The junction-package heat resistance, $R_{th}$, has been found to be on the order of $1.3–1.4\times10^{11}\Omega$, which fully meets the desired characteristics. The insulated devices have furthermore been kept inside a pressure cooker for over two hours at a temperature of about 100° C. After this treatment, the insulation did not show peeling. Likewise, the devices were subjected to dry etching with a temperature of about 175° C. for approximately eight hours, and the devices were immersed from the terminal end in solder for about 10 seconds and at the temperature of about 240° C. so as to make contact with the package over about 2 mm. The insulation did not separate in these last two cases either.

It is possible to use other materials for the insulating layer, such as nylon, mylar, acrylic resins, or different materials that compose the solder mask, such as acrylic materials and polyimide.

The insulating layer can furthermore be applied with other methods, such as for example electrochemically, chemically, by vacuum, by gluing, and so forth.

Having thus described at least one illustrative embodiment of the invention, various alterations, modifications, and improvements will readily occur to those skilled in the art. Such alterations, modifications, and improvements are intended to be within the spirit and scope of the invention. The materials employed, as well as their shapes and dimensions, may be any required. Accordingly, the foregoing description is by way of example only and is not intended as limiting. The invention is limited only as defined in the following claims and the equivalents thereto.

What is claimed is:

1. A method of electrically insulating at least one heat sink of an electronic power device, the method comprising the steps of:

forming an insulated layer from solder mask on a face of the at least one heat sink wherein the forming step comprises the steps of:

(a) inserting the electronic power device in a mold so that the face of the at least one heat sink protrudes above an outer surface of the mold;

(b) disposing a layer of material on the face of the at least one heat sink and on the outer surface of the mold;

(c) curing a region of the layer of material disposed on the face of the at least one heat sink to form an insulating layer; and (d) removing an uncured region of the layer of material disposed on the outer surface of the mold.

2. The method according to claim 1, wherein step (b) includes disposing an insulating layer that includes dry epoxy resin.

3. The method according to claim 1, wherein step (c) includes polymerizing the region of the layer of material disposed on the face of the at least one heat sink by exposure to ultraviolet rays.

4. The method according to claim 1, wherein step (d) includes chemically etching the uncured region.

5. The method according to claim 1, further comprising a second curing step, performed after step (d), to cure the region of the insulating layer disposed on the face of the at least one heat sink.

6. The method according to claim 5, wherein the second curing step comprises the steps of:

(e) further polymerizing the region of the insulating layer disposed on the face of the at least one heat sink by exposure to ultraviolet rays; and (f) heating the electronic power device.

7. The method according to claim 6, wherein step (f) further includes heat curing a package of the electronic power device.

8. The method according to claim 1, wherein step (a) includes inserting the electronic power device in the mold so that the face of the at least one heat sink protrudes above the outer surface of the mold by an amount no greater than a thickness of the insulating layer.

9. The method according to claim 1, wherein step (b) includes disposing the layer of material with a laminating machine used in producing printed circuits.

10. The method according to claim 1, wherein the forming step includes applying the solder mask from a roller on which the solder mask is rolled.

11. The method according to claim 1, wherein the forming step includes spreading a layer of material on the face of the at least one heat sink and on an outer surface of a mold through a screen-printing frame.

12. The method according to claim 1, wherein step (b) includes spreading a layer of liquid epoxy resin.

13. The method according to claim 12, wherein step (c) includes polymerizing a region of the layer of material disposed on the face of the at least one heat sink by exposure to ultraviolet rays.

14. The method according to claim 13, further comprising a heat curing step to cure the layer of material disposed on the face of the at least one heat sink.

15. The method according to claim 14, wherein the heat curing step includes heat curing a package of the electronic power device.

16. The method according to claim 1, wherein the forming step includes forming the insulating layer from a material selected from the group consisting of nylons, mylars, acrylic resins, polyimides, epoxy resins and mixtures thereof.

17. The method according to claim 1, wherein the forming step includes gluing the insulating layer.

18. The method according to claim 1, wherein the forming step includes forming the insulating layer by an electrochemical process.

19. The method according to claim 1, wherein the forming step includes forming the insulating layer by a chemical process.

20. The method according to claim 1, wherein the forming step includes forming the insulating layer by a vacuum process.

21. The method according to claim 8, wherein step (b) includes disposing an insulating layer that includes dry epoxy resin.

22. The method according to claim 8, wherein step (b) includes disposing an insulating layer that includes liquid epoxy resin.

23. The method according to claim 8, wherein step (b) includes disposing the layer of material with a laminating machine used in producing printed circuits.

24. The method according to claim 8, wherein step (c) includes polymerizing the region of the layer of material disposed on the face of the at least one heat sink by exposure to ultraviolet rays.

25. The method according to claim 8, wherein step (d) includes chemically etching the uncured region.

26. The method according to claim 25, further comprising the steps of:

(e) further polymerizing the region of the insulating layer by exposure to ultraviolet rays; and (f) heating the electronic power device.

27. The method according to claim 26, wherein step (f) further includes heat curing a package of the electronic power device.

28. A method of reducing heating of an electronic power device within a system, the system including a chassis, a package supported by the chassis and having a first surface and a second surface, an electronic power device having an outer surface and being partially disposed within the package so that the outer surface of the electronic power device is flush with the first surface of the package, and a heat sink having an inner surface and an outer face, wherein the inner surface of the heat sink is disposed along the outer surface of the electronic power device and the heat sink is partially disposed within the package so that the outer face of the heat sink is flush with the second surface of the package, the method comprising the steps of:

connecting a layer of thermally conducting material from the outer face of the heat sink to the chassis to place the heat sink and the chassis in thermal communication, so that when the electronic power device is operated, heat produced by the electronic power device is conducted from the heat sink, through the layer of thermally conducting material, to the chassis.

29. The method of claim 28, wherein the connecting step includes connecting a layer of thermally conducting material which is electrically insulating.

30. A method of arranging a system that includes a chassis, a package, an electronic power device having an outer surface, a heat sink including a first material and having an outer face, and a layer of a second material, the method comprising the steps of:

(a) supporting the package from the chassis;

(b) disposing the electronic power device at least partially within the package;

(c) disposing the heat sink along the outer surface of the electronic power device;

(d) disposing the layer of the second material along the outer face of the heat sink; and (e) connecting the layer of the second material to the chassis.

31. The method of claim 30, wherein the package includes a first surface, and wherein step (b) includes a step of disposing the electronic power device at least partially within the package so that the outer surface of the electronic power device is flush with the first surface of the package.

32. The method of claim 31, wherein the package further includes a second surface, and wherein step (c) includes a step of disposing the heat sink along the outer surface of the electronic power device so that the outer face of the heat sink is flush with the second surface of the package.

33. The method of claim 30, wherein the layer of the second material disposed in step (d) is electrically insulating and thermally conducting.

34. The method of claim 30, wherein step (d) includes disposing the layer of the second material with a laminating machine used in producing printed circuit boards.

* * * * *